US006452857B1

(12) United States Patent
Alofs et al.

(10) Patent No.: US 6,452,857 B1
(45) Date of Patent: Sep. 17, 2002

(54) CIRCUITS FOR CONTROLLING THE STORAGE OF DATA INTO MEMORY

(75) Inventors: Thomas Alofs, Grenoble; Nicolas Grossier, Saint Georges de Comuniers, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/563,186

(22) Filed: May 2, 2000

(30) Foreign Application Priority Data

May 3, 1999 (EP) .......................................... 99410045

(51) Int. Cl.[7] .................................................. G11C 8/00
(52) U.S. Cl. ............................. 365/230.06; 365/230.08
(58) Field of Search ......................... 365/230.06, 230.08

(56) References Cited

U.S. PATENT DOCUMENTS

| 4,336,601 A | * | 6/1982 | Tanaka ........................ 364/900 |
| 4,528,665 A | * | 7/1985 | Burns et al. .................. 371/51 |
| 5,083,296 A | | 1/1992 | Hara et al. ............. 365/230.02 |
| 5,812,482 A | | 9/1998 | Jiang et al. ............ 365/230.06 |

FOREIGN PATENT DOCUMENTS

| EP | 0 416 714 | 3/1991 | ............ G11C/8/00 |
| JP | 405307891 | * 11/1993 | ......... G11C/11/413 |

OTHER PUBLICATIONS

Betty Prince, "Semiconductor Memories", 1983, Wiley, 2nd pp. 77–81.*
European Search Report from European Application No. 99410045.1.

* cited by examiner

*Primary Examiner*—M. Tran
(74) *Attorney, Agent, or Firm*—Wolf, Greenfield & Sacks, P.C.; James H. Morris; Robert A. Skrivanek, Jr.

(57) ABSTRACT

A circuit for controlling the storage of data in a memory element including a bistable device having a first input for receiving an address input and a second input for receiving a clock signal and circuitry for receiving the output of the bistable device and the clock signal and providing a write enable signal for the memory, the circuitry being arranged so that the write enable signal is enabled in response to a first transition in the clock signal from a first state to a second state and disabled in response to the clock signal making the next transition back to the first state, the first and next transitions being in the same clock cycle.

10 Claims, 3 Drawing Sheets

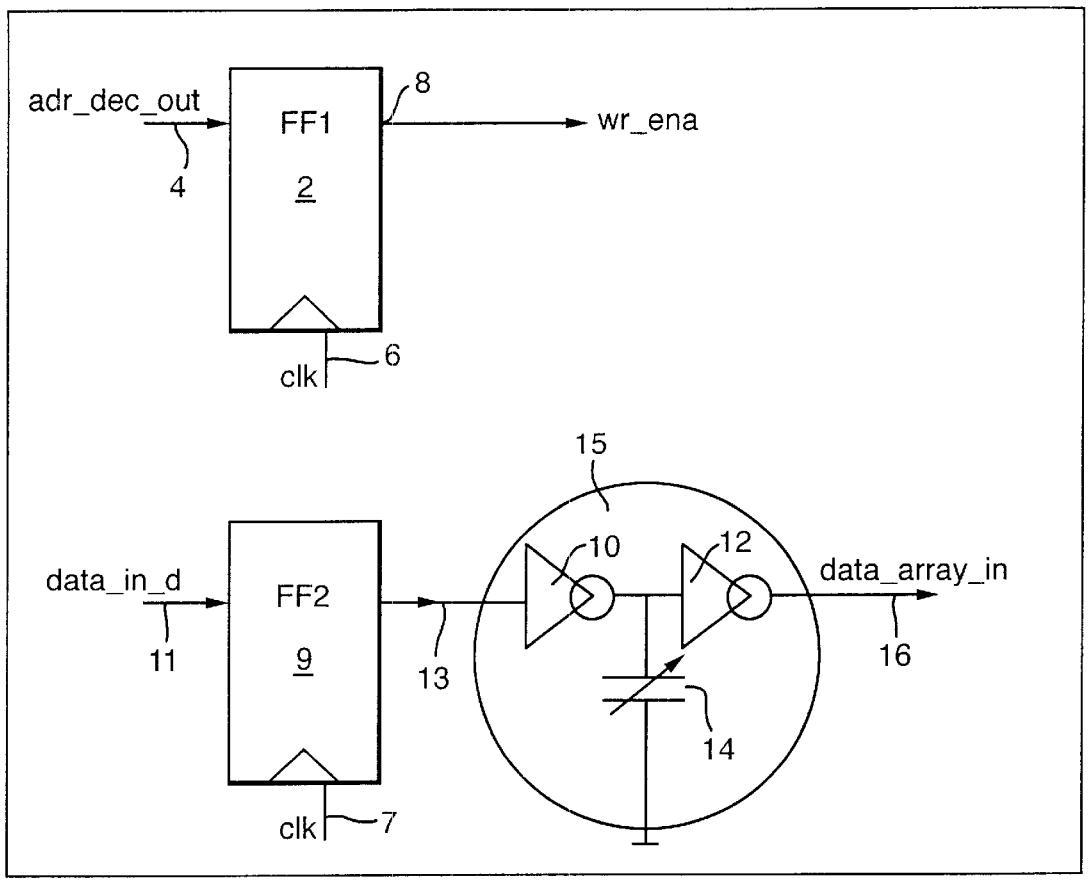
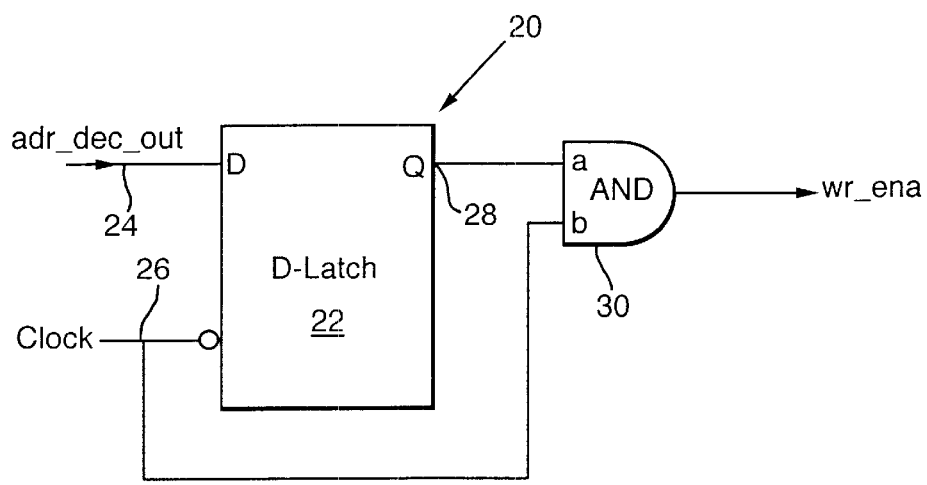

1.) data delayed (ok):

2.) wr_ena delayed:

CIRCUITS FOR CONTROLLING THE STORAGE OF DATA INTO MEMORY

FIELD OF THE INVENTION

The present invention relates to a circuit for controlling the storage of data into memory and in particular but not exclusively to a pulse generator. The memory may be a first-in-first-out (FIFO) memory array.

BACKGROUND TO THE INVENTION

Reference is made to FIG. 1 which shows a known arrangement which has a first flip flop 2. The first flip flop 2 has a clock input 6 for receiving a clock signal clk. The first flip flop 2 also has an input 4 for receiving a decoded address adr dec out. That decoded address adr_dec_out is output via output 8 of the first flip flop 2 and provides a write enable signal. A second flip flop 9 also receives a clock signal clk via input 7 and the data to be written to a memory via input 11. The output 13 of the second flip flop 9 is input to a first inverter 10. The output of the first inverter 10 is input to a second inverter 12. A capacitor is provided between the output of the first inverter 10 and ground. The first and second inverters 10 and 12 and the capacitor 14 together constitute a delay element 15. In other words, the output of the second flip flop 9 is provided at the output of the second inverter 12 but a delayed time after it is input to the first inverter 10. The output of the second inverter 12 provides a data signal data_array_in to be written to a column of the memory array. If the write enable signal wr_ena is high, then the data data_array_in will be written into a memory cell contained in that column enabled by the write enable signal.

Reference is now made to FIGS. 2a to c. FIG. 2a shows the timing of the clock signal clk input to the first and second flip flops 2 and 9 for three clock cycles CYCLE 1–3. FIG. 2a shows a first scenario for the timing of the data from the second flip flip 9 to be written into the memory cells and the write enable signal from the first flip flop 2. As indicated by Reference A, the write enable signal is disabled well before the next data is received by the second flip flop. This next data is associated with a different write enable signal. FIG. 2c shows a second scenario where the write enable signal wr_en for first data is still enabled when the next data is received. This is indicated by reference B. When the write enable signal has the high level, data can be written into an appropriate location in the memory array.

As can be seen the data signal transitions and the write enable signal transitions occur more or less at the same time. This gives rise to the problem of shoot through effects. With shoot through effects, the wrong data may be written to the wrong memory cell. For example, with the second scenario shown in FIG. 2c the write enable signal for first data is still enabled when the next data is received. The wrong data may therefore be written into the wrong cell. This can occur if that write signal is high when the data from the previous cycle is available. Likewise, the data from the subsequent cycle intended for the cell in column n−1 may be written into a memory cell in column n because the first write enable signal wr_ena is still enabled when the next bit of data for the cell in column n−1 is received. Both of these scenarios are undesirable.

The delay element 15 is provided to attempt to deal with this problem. This delay element is provided so that the write enable signal is delayed with respect to the arrival time of the data signals. However, this arrangement has the disadvantage that the delay provided is dependent on the length of wires and position of the flip flops. Accordingly, it is difficult to accurately predict the delay that would be provided by the delay element 15 and this can cause difficulties.

If the delay element is not adjusted correctly, shoot-through effects might persist.

SUMMARY OF THE INVENTION

It is therefore an aim of embodiments of the present invention to address these problems.

According to one aspect of the present invention, there is provided a circuit for controlling the storage of data in a memory element, said circuit comprising a) a bistable device having a first input for receiving an address input and a second input for receiving a clock signal; and b) circuitry for receiving the output of the bistable device and the clock signal and providing a write enable signal for said memory, the circuitry being arranged so that the write enable signal is enabled in response to a first transition in the clock signal from a first state to a second state and disabled in response to the clock signal making the next transition back to the first state, said first and next transitions being in the same clock cycle.

In this way, it can be ensured that the write enable signal is disabled well before the end of a given clock cycle.

Preferably, the duration of an enabled write enable signal is substantially the same as half a clock cycle.

Embodiments of the invention may be advantageous in that no special care needs to be taken to avoid "shoot through" effects. The embodiments may inherently deal with this problem.

The bistable circuit may be a latch. This latch may be a D-latch.

The circuitry may comprise an AND gate or any other suitable circuitry.

The state of said write enable signal when enabled is dependent on the address of the first input when said clock signal is first enabled.

According to a second aspect of the present invention there is provided a write enable signal generator having a plurality of circuits as discussed hereinbefore, each of said circuits providing a write enable signal for a respective element of a memory array. That memory element may be a column or the like of the memory array.

According to a third aspect of the present invention, there is provided a memory arrangement comprising a generator as defined hereinbefore and a plurality of memory elements, said memory elements being equal in number to said circuits. The memory array may be a FIFO memory array or any other suitable memory array.

BRIEF DESCRIPTION OF THE DRAWINGS

For a better understanding of the present invention and as to how the same may be carried into effect, reference will now be made by way of example to the accompanying drawings in which:

FIG. 1 shows a known arrangement for controlling data storage in a memory array;

FIG. 3 shows a circuit for controlling the writing of data into a memory array embodying the present invention;

DETAILED DESCRIPTION OF EMBODIMENTS OF THE INVENTION

Figure 2A:
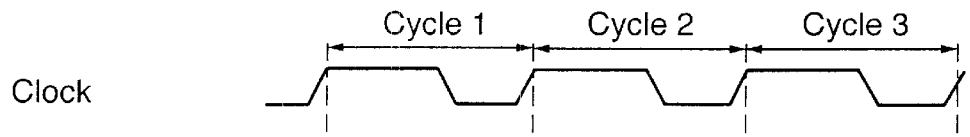
FIG. 2a shows a clock signal.
Figure 2B:
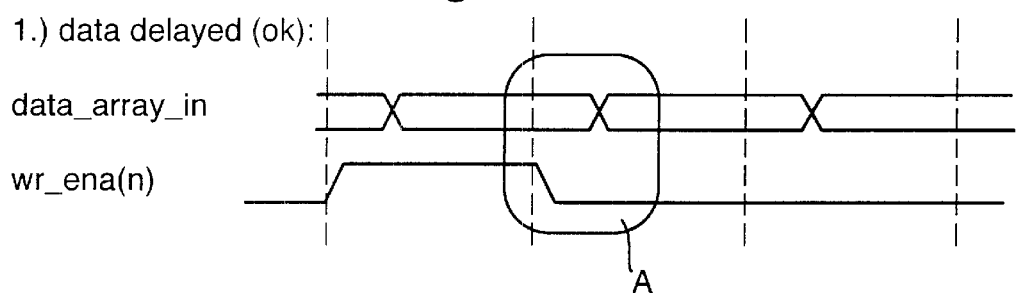
FIG. 2b shows the timing of data and write enable signals in a known circuit for a memory array where there are no shoot through effects.

The circuit for controlling data storage 20 comprises a D-latch 22. The D-latch is sometimes referred to as a half latch. The D-latch 22 receives a D-input 24 consisting of a decoded address adr_dec_out. This decoded address adr_dec_out will be high if the memory column to which the circuit 20 is attached is to have data written thereto. Otherwise the decoded address adr dec out provided to the D-input 24 will be low. A clock signal is input via a second input 26. The D-latch 22 has a Q output 28. The Q output 28 will provide the signal received at its first D-input 24 when the clock signal 26 is high. The D-latch stores the value of its D-input 24 to its Q output 28 from the moment when the clock signal becomes high. Once the clock signal is high and as long as it remains high, any changes at the input of the D-latch will not be propagated to its output Q.

The Q output 28 is connected to the first input a of an AND gate 30. A second input b to the AND gate 30 is provided by the clock signal which is provided to the clock input 26 of the D-latch 22. The output of the AND gate 30 provides a write enable signal wr_ena. When the decoded address adr_dec_out is high and the clock signal becomes high, an enabled write signal wr_ena will be provided by the AND gate 30 for the duration of half a clock cycle. In all other situations, the AND gate 30 will provide a disabled write enable signal. The Q output 28 will respond to the changes at the D input 24 when the clock signal is low. When the clock signal is low, the write enable wr_ena signal is low. Any changes of the Q output of the half-latch when the clock signal is low are not propagated to the write enable output since the second input b of the AND gate 30 is low. This arrangement ensures that the write enable wr_ena signal is always forced to '0' after approximately a ½ clock-cycle. In this particular embodiment of the present invention, a write enable signal has a high level if a particular column is to be written to. In other embodiments of the invention, the opposite may be true.

Figure 2C:
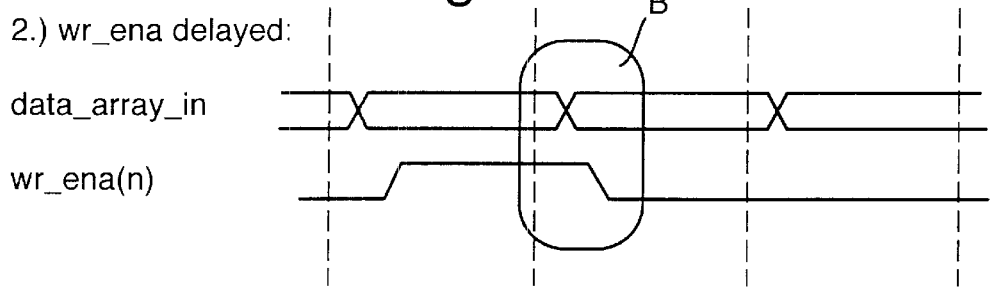
FIG. 2c shows the timing of write enable signals in a known arrangement where there are shoot through effects.
Figure 2D:
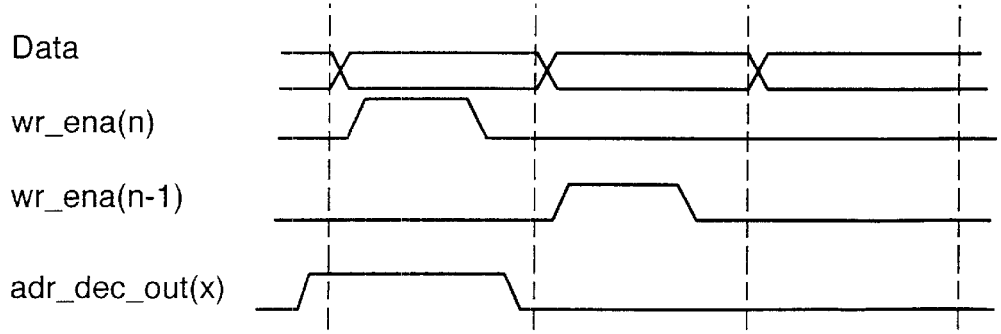
FIG. 2d shows the timing of write enable signals in accordance with embodiments of the present invention.

Reference will now be made to FIGS. 2a and 2d. Three cycles CYCLE 1 to 3 of the clock input provided to the clock input 26 are shown in FIG. 2a and in FIG. 2d the timing of the data to be written to the various cells in each of the clock cycles is shown. One cell is to be written to in each cycle. The output of the address decoder for one of the memory columns is also shown in FIG. 2d. FIG. 2d shows two write enable signals wr_ena(n) and wr_ena(n-1). These write enable signals are output from different circuits 20 and are intended to control different memory columns.

As can be seen from FIG. 2d, the write enable signal wr_ena_(n) and wr_ena-(n-1) will go high sometime after the clock signal has gone high in a respective clock cycle. The write enable signal wr_ena_(n) and wr_ena-(n-1) will also go low a short time after the clock signal has gone low in that same clock cycle. This is well before the occurrence of the next rising edge of the clock signal for the next clock cycle. The first write enable signal wr_ena_(n) is thus high for about half of the first clock cycle CYCLE 1. Likewise the second write enable signal wr_ena_(n-1) is thus high for about half of the second clock cycle CYCLE 2. Only one write enable signal is high at a time.

The write enable signal when enabled thus follows the first half of the clock signal but lags it by a short time. The duration of the enabled write enable signal is approximately half a clock cycle. As can be seen from a comparison of FIGS. 2c and 2d, the problems of shoot through effects can be avoided. This is because the write enable signal is disabled well before the next clock cycle when the next bit of data is available. In one preferred embodiment of the invention, the write enable signal is enabled during the first half of a clock cycle so that a read cycle can take place in the second part of the clock cycle. This can improve data throughput in a FIFO circuit.

Figure 4:
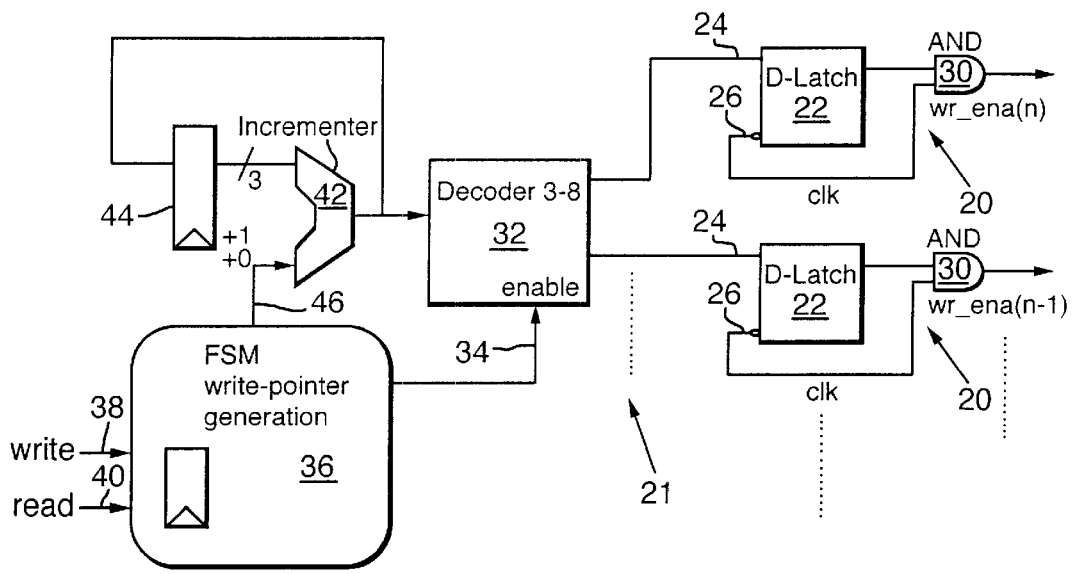
FIG. 4 shows a schematic view of a write enable signal generator incorporating circuits for controlling data storage as shown in FIG. 3.

Reference is now made to FIG. 4 which shows a schematic view of a write enable signal generator 21 incorporating the embodiment of FIG. 3. The arrangement of FIG. 4 has n circuits 20 for controlling the data storage, one for each of n columns contained in a memory array. In this embodiment n is equal to 8. The decoded address received by each of the circuits 20 are provided by an address decoder 32. The address decoder is a 3 to 8 decoder. This means that the decoder 32 receives a address defined by three bits and provides an eight bit output, with one bit for each circuit 20. All but one of those bits will be low. The bit which is high will be input to the circuit 20 associated with the column to which data is to be written.

The decoder 32 receives an enable signal 3 via an enable input 34 from a finite state machine (FSM) write point generator 36. The FSM write pointer generator 36 receives a write input 38 and a read input 40. If data is to be written to a given location, the write input 3S will be high. Likewise, if data is to be read from a given location, the read input 40 will be high. If the write input 38 is high, then the enable input 34 received from the finite state machine write point generator 36 will also be high. During read operations, the enable input 34 to the decoder 32 will be low. No signals will be provided on the output of the decoder 32 in this latter situation. However, in other embodiments of the present invention, it may be possible to read and write to the same location in the same cycle.

The decoder 32 receives an input from an incrementer 42 which defines the column address to be decoded. The incrementer 42 receives a three bit address. That three bit address may be temporarily stored in a buffer 44 or the like. This address may be incremented as the memory is a FIFO. With FIFOs, data is written into consecutive memory addresses. The write pointer is therefore incremented at each write cycle. If an incrementing output 46 from the finite state machine write pointer generator 36 is high, then the address output from the buffer 44 is incremented by 1. The incremented address is output to the decoder 32 and also fed back to the buffer 44. If the incrementing output 46 is low, no change is made to the address output by the buffer 44. In that way, consecutive addresses can be written to in subsequent write operations.

The memory elements of the memory array are columns or slots of data having a defined width in a memory array. The memory array is built of multiple slots or columns. The write enable signal is for enabling a column in the memory array. The write enable signal selects a column for data storage. The columns are built of D-latches and the write enable signal is connected to each of the inputs of the D-latches enabling the switch for storage into the memory cell.

Figure 5:
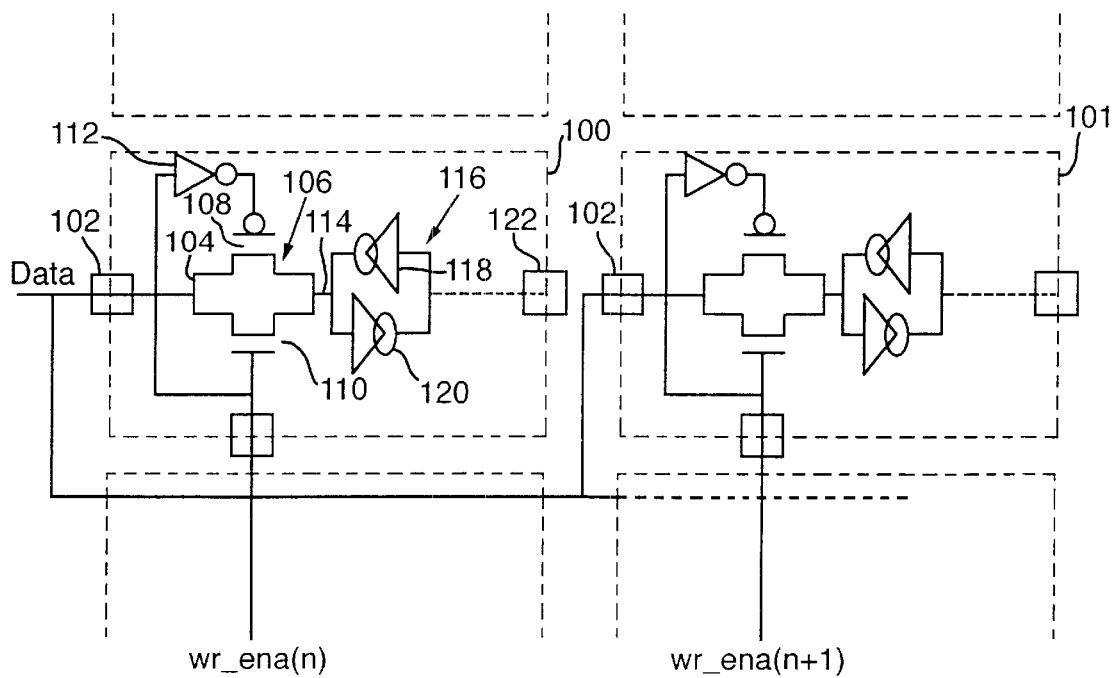
FIG. 5 shows a schematic diagram of a FIFO memory array with which embodiments of the present invention can be used.

Reference is now made to FIG. 5 which shows two cells 100 of the FIFO memory array in different columns. In practice, considerably more than two cells would usually be provided. Each cell has a data input 102 for receiving data to be written into the cell 100. These cells 100 are in different columns and thus receive different write enable signals.

The data input 102 is connected to the input side 104 of a pass gate 106. The pass gate 106 has an n-type field effect transistor 110 and a p-type field effect transistor 108. The gate of the n-type transistor 110 is arranged to receive the write enable signal wr_ena(n) or wr_ena(n+1) from for example the circuitry shown in FIG. 3. The write enable signal is also input to an inverter 112, the output of which is connected to the gate of the p-type transistor 106. The gate of the p-type transistor 106 thus receives the inverse of the write enable signal. Accordingly, if the write enable signal is high, both of the transistors 108 and 110 of the pass gate will be on. Data can be written into the memory cell. Likewise, if the write enable signal is low, both of the transistors 108 and 110 of the pass gate 106 will be off. Data cannot be written into the memory cell.

The output side 114 of the pass gate 106 is connected to a latch 116. The latch 116 comprises first and second inverters 118 and 120 and will store the data. The output of the latch 116 is connected to a second pass gate (not shown) which is used in read operations. The output of the second pass gate is connected to a read output 122.

When the write enable signal is high, data can be written into the memory cell and is effectively stored by the latch 116.

Embodiments of the invention may be incorporated in integrated circuits.

Other types of circuitry can replace the AND gate. Likewise, the D-latch may be replaced by other types of bistable devices.

What is claimed is:

1. A circuit for controlling the storage of data in a memory element, said circuit comprising:
   a) a bistable device having a first input for receiving an address input and a second input for receiving a clock signal; and
   b) circuitry for receiving an output of the bistable device and the clock signal and providing a write enable signal for said memory element, the circuitry being arranged so that the write enable signal is enabled in response to a first transition in the clock signal from a first state to a second state and disabled in response to the clock signal making a next transition from the second state back to the first state, the first and next transitions being in a same clock cycle of the clock signal.

2. A circuit for controlling the storage of data in a memory element, said circuit comprising:
   a) a bistable device having a first input for receiving an address input and a second input for receiving a clock signal; and
   b) circuitry for receiving an output of the bistable device and the clock signal and providing a write enable signal for said memory element, the circuitry being arranged so that the write enable signal is enabled in response to a first transition in the clock signal from a first state to a second state and disabled in response to the clock signal making a next transition from the second state back to the first state, the first and next transitions being in a same clock cycle of the clock signal;
   wherein the write enable signal is enabled for a duration that is substantially half a clock cycle of the clock signal.

3. A circuit as claimed in claim 2, wherein the write enable signal is enabled for substantially a first half of the clock cycle.

4. A circuit for controlling the storage of data in a memory element, said circuit comprising:
   a) a bistable device having a first input for receiving an address input and a second input for receiving a clock signal; and
   b) circuitry for receiving an output of the bistable device and the clock signal and providing a write enable signal for said memory element, the circuitry being arranged so that the write enable signal is enabled in response to a first transition in the clock signal from a first state to a second state and disabled in response to the clock signal making a next transition from the second state back to the first state, the first and next transitions being in a same clock cycle of the clock signal;
   wherein the bistable device is a latch.

5. A circuit as claimed in claim 4, wherein said latch is a D-latch.

6. A circuit as claimed in claim 1, wherein said circuitry comprises a AND gate.

7. A circuit as claimed in claim 1, wherein a state of the write enable signal when enabled is dependent on an address of the first input when the clock signal is first enabled.

8. A write enable signal generator comprising a plurality of circuits, each said circuit being arranged to control storage of data in a memory element and comprising:
   a) a bistable device having a first input for receiving an address input and a second input for receiving a clock signal; and
   b) circuitry for receiving the output of the bistable device and the clock signal and providing a write enable signal for said memory element, the circuitry being arranged so that the write enable signal is enabled in response to a first transition in the clock signal from a first state to a second state and disabled in response to the clock signal making the next transition back to the first state, said first and next transitions being in the same clock cycle, each of said circuits providing a write enable signal for a respective memory element of a memory array.

9. A memory arrangement comprising a write enable generator comprising a plurality of circuits, each said circuit being arranged to control storage of data in a memory element and comprising:
   a) a bistable device having a first input for receiving an address input and a second input for receiving a clock signal; and
   b) circuitry for receiving the output of the bistable device and the clock signal and providing a write enable signal for said memory element, the circuitry being arranged so that the write enable signal is enabled in response to a first transition in the clock signal from a first state to a second state and disabled in response to the clock signal making the next transition back to the first state, said first and next transitions being in the same clock cycle, each of said circuits providing a write enable signal for a respective memory element of a memory array, said arrangement further comprising a plurality of memory elements, said memory elements being equal in number to said circuits.

10. A memory arrangement as claimed in claim 9 wherein said memory array is a FIFO memory array.

* * * * *